United States Patent [19]

Wang et al.

[11] Patent Number: 5,192,695
[45] Date of Patent: Mar. 9, 1993

[54] METHOD OF MAKING AN INFRARED DETECTOR

[75] Inventors: Cheng-Chi Wang; Yet-Zen Liu, both of Westlake Village; Muren Chu, Thousand Oaks, all of Calif.

[73] Assignee: Fermionics Corporation, Simi Valley, Calif.

[21] Appl. No.: 727,402

[22] Filed: Jul. 9, 1991

[51] Int. Cl.$^5$ .................................. H01L 31/18
[52] U.S. Cl. .................................. 437/5; 437/3; 148/DIG. 31
[58] Field of Search ............ 437/2, 3, 4, 5, 980, 437/946, 965; 136/256, 258, 260; 148/DIG. 31

[56] References Cited

U.S. PATENT DOCUMENTS

| | | |
|---|---|---|
| 3,799,803 | 3/1974 | Kraus et al. |
| 3,845,494 | 10/1974 | Ameurlaine |
| 3,858,306 | 1/1975 | Kloek et al. ............ 437/5 |
| 4,132,999 | 1/1979 | Malle |
| 4,137,544 | 1/1979 | Koehler |
| 4,170,666 | 10/1979 | Pancholy |
| 4,376,663 | 3/1983 | Wang et al. ............ 437/946 |
| 4,947,223 | 8/1990 | Biefeld et al. ............ 437/5 |
| 5,015,592 | 5/1991 | Moldovan ............ 437/3 |
| 5,061,656 | 10/1991 | Moyer et al. ............ 148/DIG. 31 |

FOREIGN PATENT DOCUMENTS 155  1/1988  Japan .................................. 437/5

Primary Examiner—Brian E. Hearn
Assistant Examiner—Linda J. Fleck
Attorney, Agent, or Firm—Poms, Smith, Lande & Rose

[57] ABSTRACT

HgCdTe semiconductor material having an n-type epitaxial layer is grown on a substrate. A graded p-type epitaxial layer is grown on the n-type layer. The p-type layer is graded such that the large bandgap region is adjacent the heterojunction with the narrow bandgap region at the surface of this layer. The periphery of the p-type layer is then etched to expose the large bandgap material. A HgCdTe passivation layer may then be formed on the p-type layer. A resultant structure is then mesa etched. A metal, such as indium, is formed along the walls of the mesa structure. Indium is selected to form a good ohmic contact with the n-type layer and a Schottky barrier with the large bandgap exposed edge of the p-type layer. In this way, the PN junction is passivated at the large bandgap material. The remaining narrow bandgap material in the p-type will form a good ohmic contact to a metal contact formed on this layer.

39 Claims, 3 Drawing Sheets

METHOD OF MAKING AN INFRARED DETECTOR

FIELD OF THE INVENTION

The present invention relates generally to semiconductor devices, and more particularly to a novel method for passivating such detectors and an infrared detector fabricated by such method.

BACKGROUND OF THE INVENTION

Passivation of mercury cadmium telluride (HgCdTe) surfaces in exposed junctions, particularly in materials responsive to radiant energy in the 8-12 micrometer wavelength, is a difficult problem. The technology of thick native oxide growth in HgCdTe is not available.

In U.S. Pat. No. 3,799,803, which issued in Mar. 1974, the passivation of a semiconductor surface, namely HgCdTe, is described by means of a hydrogen peroxide rinse to remove contaminants from the surface.

In U.S. Pat. No. 3,845,494, which issued in Oct., 1974, a HgCdTe photovoltaic detector is described covered by a continuous film of material such as a metallic sulfide or selenide for preventing outward diffusion of mercury vapor from the detector. The film or coating which is impervious to mercury may include zinc sulfide, zinc selenide or arsenic pentaselenide.

In U.S. Pat. No. 4,132,999, issued Jan., 1979, a PN junction is formed in HgCdTe material by diffusing mercury through a protective layer of cadmium telluride. A mask of zinc sulfide defines the boundaries of the PN junction formed beneath the layer of cadmium telluride.

In U.S. Pat. No. 4,137,544, issued Jan., 1979, a HgCdTe diode is formed by a ion implanting accepter impurity such as phosphorus, antimony or arsenic into an N-type substrate of HgCdTe. In addition, accumulation is formed at the surface of the HgCdTe substrate to surround the p-type region formed by ion implantation. The ion implantation is performed right through a passivation layer such as anodic oxide. An additional mask is provided above the passivation layer to define the p region. The resulting PN junction is formed within the HgCdTe substrate and extends to the surface which is protected by the passivation layer. The diode is particularly useful for detection of radiation in the range from 8-14 micrometers.

In U.S. Pat. No. 4,170,666, which issued in Oct., 1979, the effective surface recombination velocity of III-V compounds semiconductors is reduced by providing a native dielectric passivation layer on the semiconductor and by inducing a potential in the vicinity of the semiconductor-dielectric interface which repels approaching minority carriers. A layer of gallium arsenide phosphide (GaAsP) is formed by converting the surface of GaAs. GaAsP has a higher energy band gap than GaAs and increases the energy which minority carriers must posses in order to reach the interface of the GaAsP and a gallium phosphorus oxide passivation dielectric.

It is therefore desirable to fabricate PN junctions in HgCdTe substrates with reduced surface leakage current and higher $R_0A$ products by forming the PN junction underneath the protective surface. One typical prior art solution which is disclosed in U.S. Pat. No. 4,549,195, issued Oct., 1985. The heterojunction semiconductor device has the PN heterojunction between two layers of material each having a different band gap. The edges of the PN heterojunction are buried or concealed below the surface of one of the layers to reduce leakage occurring across the PN heterojunction. More particularly, the layer having the greatest energy bandgap fully covers the boundaries or perimeter of the layer having the lesser energy bandgap.

A disadvantage and limitation of passivation technique of the '195 patent is that a mesa etch of the narrow bandgap materials required prior to growing of the large bandgap layer. The crystal orientation of the sidewalls of the mesa are not oriented properly for epitaxial growth of cadmium telluride thereon. Therefore, in the prior art approach, the junction may not be passivated.

SUMMARY OF THE INVENTION

It is therefore and object of the present invention to overcome one or more disadvantages and limitations of the prior art hereinabove mentioned. It is another object of the present invention to provide a novel method for fabricating a semiconductor device wherein layers on each side of the heterojunction are selected such that a metal coating along the edge of each layer and covering the edge of the junction forms an ohmic contact with one layer and a Schottky barrier with the other layer to passivate the junction edge. It is another object of the present invention to form a graded layer on the heterojunction such that the wide bandgap material is adjacent the junction to facilitate passivation of the narrow bandgap material being provided to make the only contact to the device. It is another object of the present invention to provide photodetector which is responsive to long wave infrared radiation in the 8-12 micron wavelength.

According to the present invention, a HgCdTe has an n-type epitaxial layer grown on a substrate. A graded p-type epitaxial layer is grown on the n-type layer. The p-type layer is graded such that the large bandgap region is adjacent the heterojunction with the narrow bandgap region at the surface of this layer. The periphery of the p-type layer is then etched to expose the large bandgap material. A HgCdTe passivation layer may then be formed on the p-type layer. A resultant structure is then mesa etched. A metal, such as indium, is formed along the walls of the mesa structure. Indium is selected to form a good ohmic contact with the n-type layer and a Schottky barrier with the large bandgap exposed edge of the p-type layer. In this way, the PN junction is passivated at the large bandgap material. The remaining narrow bandgap material in the p-type layer will form a good ohmic contact to a metal contact formed on this layer.

These and other objects, advantages and features of the present invention will become readily apparent to those skilled in the art from a study of the following Description of an Exemplary Preferred Embodiment when read in conjunction with the attached Drawing and appended Claims.

DESCRIPTION OF AN EXEMPLARY PREFERRED EMBODIMENT

Figures 4A, 4B:
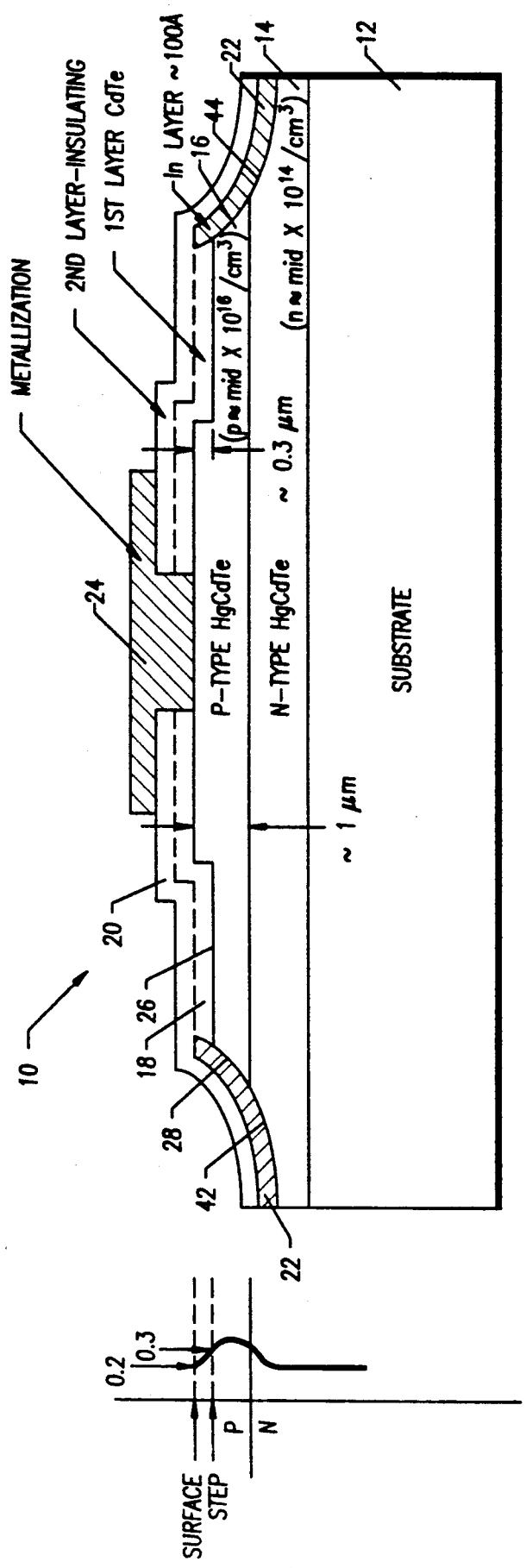
FIG. 4a is a cross-sectional view of a HgCdTe infrared detector constructed according to the principles of the present invention.
FIG. 4b is a chart showing the concentration variation of cadmium within the HgCdTe layers.

Referring now initially to FIG. 4a, there is shown a HgCdTe detector 10. The detector 10 includes a CdTe substrate 12, an n-type HgCdTe first device layer 14, a p-type HgCdTe second device layer 16, a first passivation layer 18, a second passivation layer 20, a metal layer 22 and a electrode 24. As will become apparent from the description hereinbelow, the metal layer 22 forms a second electrode for the device.

A feature of the present invention is that the metal layer 22 is selected to form an ohmic contact with the first device layer 14 and the Schottky barrier with the second device layer 16. For the materials and doping shown in FIG. 4a, the first metal layer may be selected to be indium. A further feature of the present invention is that the second device layer 16 has an etched peripheral region 26. The metal layer 22 is disposed along an edge wall 28 of the peripheral region 26. When the second device layer 16 is selected to have a cadmium gradient, as shown in FIG. 4b, the peripheral region 26 is of a larger bandgap material. Therefore, passivation of the PN junction occurs in the larger bandgap material. The electrode 24 is then in contact with narrow bandgap material for good ohmic contact. Another feature of the present invention is that all passivation of the PN junction is within the larger bandgap region of the second device layer. A preferred exemplary embodiment for fabricating the infrared detector 10 is described hereinbelow with reference to FIGS. 1-3.

Figure 1:
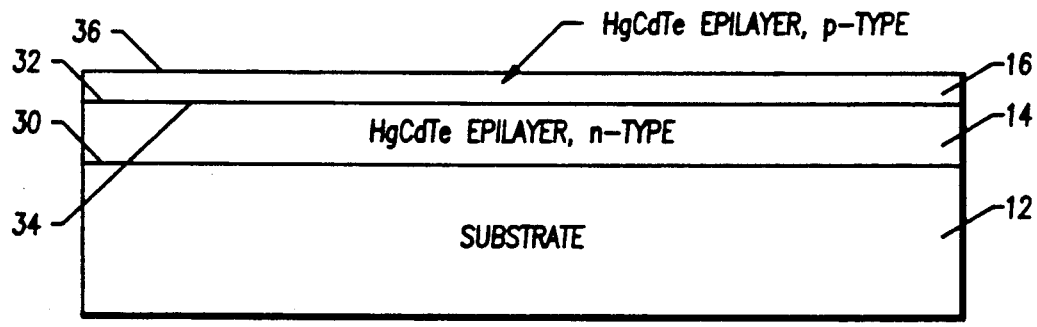
FIGS. 1-3 show a sequence of fabrication steps for a HgCdTe detector constructed according to the principles of the present invention.

Referring now to FIG. 1, substrate 12 is preferably cadmium telluride or zinc cadmium telluride. It is orientated along the <1,1,1> plane. Preferably, the orientation of the substrate should be kept to within +/− 0.5 degrees from this orientation. The substrate 12 is polished in a Br:HBr solution until both sides are shiny. An upper surface 30 of the substrate 12 is identified by preferential staining. The upper surface is chosen to be the correct side for further epitaxial growth. After the upper surface is identified, the upper surface continues to be polished to a mirror finish. Br:CH$_3$COOH solution is subsequently used to provide a final upper surface 30 prior to epitaxial growth.

The polished and cleansed substrate 12 is then loaded into a liquid-phase epitaxial furnace. An undoped or indium doped HgCdTe first device layer is grown on the upper 30 of the substrate 12. Preferably, the first device layer is grown to a thickness of 20 microns in a tellurium solution at 500° C. The composition of the HgCdTe in the second device layer 14 is controlled by the composition of the melt. The desired composition may range between 18 and 32% of cadmium telluride, with this composition being determined by the end application for the detector 10. After the growth process is complete, the furnace may be turned off.

After the substrate 12 and first device layer 14 have cooled, usually to less than 70° C., a partially fabricated device may then be taken out of the furnace and loaded into a second liquid-phase epitaxy furnace for the epitaxial growth of the second device layer 16. The second device layer 16 is grown in a mercury solution and is doped with either As or Sb to make it p-type. The carrier concentration of this layer is selected to be in the range of $2-5 \times 10^{16}$/cm$^3$. The thickness of the second device layer 16 is selected to be about one micron.

Figure 5:
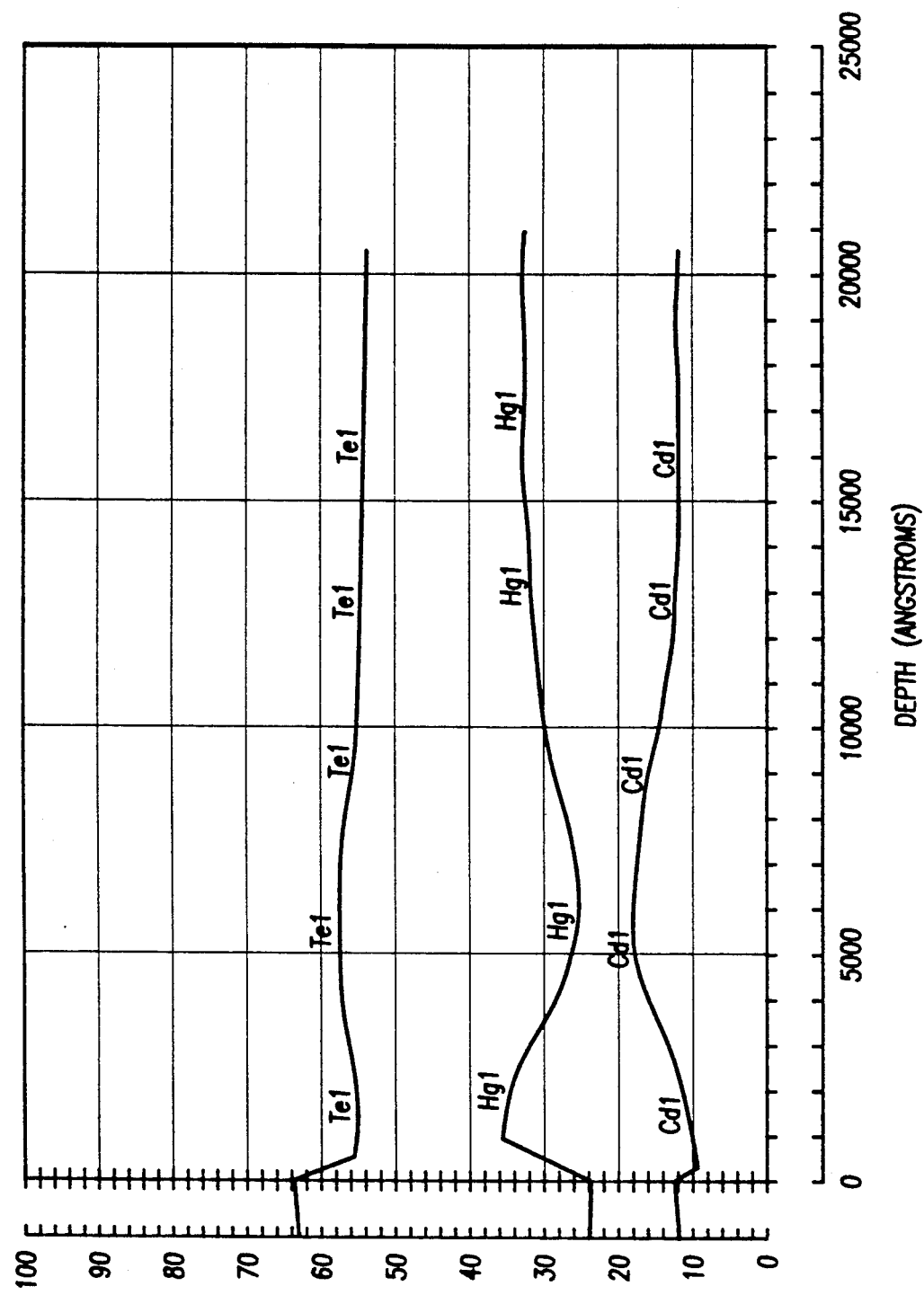
FIG. 5 is a graph showing the ratios of the composition of the p-type HgCdTe layer.

In the growth of the second device layer 16, the most important parameter to control is the cadmium composition gradient from the upper surface 32 of the first device layer 14 and the lower surface 34 of the second device layer 16 at which the PN junction is formed. The maximum cadmium composition is about 0.35 and occurs at 0.3 microns from the junction. The gradient drops to about 0.3 at 0.7 microns from the junction. The cadmium composition is at about 0.18 at an upper surface 36 of the second device layer 16. The gradient of the cadmium composition of the second layer occurs because of the depletion of cadmium content in the melt as the liquid-phase epitaxy process proceeds. The Auger line scan of the multilayer cross-section of FIG. 1 is shown in FIG. 4b. The ratios of the HgCdTe compositions of the second device layer 16 are shown in FIG. 5.

The structure of FIG. 1 is annealed to change the first device layer 14 to n-type and to keep the second device layer 16 p-type to achieve a P-on-n heterostructure. The unique feature of this heterostructure that is not only possesses the advantages of regular heterostructure PN junctions, such as reduced leakages and higher quantum efficiency, but that it also has a graded wide bandgap layer which is the basis for realizing the passivated technique of the present invention for long wavelength HgCdTe. However, it is to be recognized to those skilled in the art that producing P-on-n HgCdTe diodes is not restricted to a liquid-phase epitaxial growth herein described. Any other growth method such as molecular beam epitaxy (MBE) and molecular metallorganic chemical vapor deposition (MOCVD) would produce an equivalent structure and are within the scope of the invention.

The gradient control of the p-type second device layer in the MBE and MOCVD P-on-n heterostructure can also be achieved by any fabrication method known or contemplated in the art. The important condition is that there is a substantial wide bandgap p-type region in the second device layer and that the bandgap is narrowed down toward the upper surface 36 for ease of providing a good ohmic contact to the top p-type surface 36 of the second device layer 16.

Figure 2:
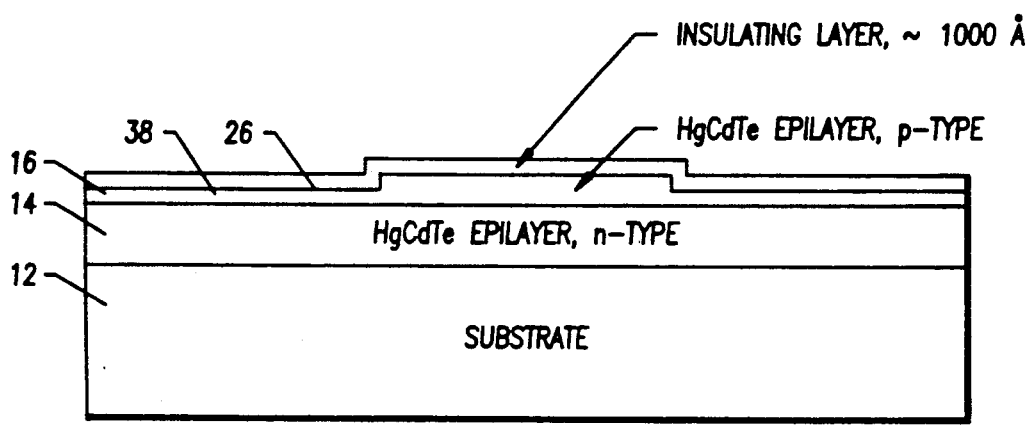

With further reference to FIG. 2, the upper surface 36 of the second device layer 16 is etched to a depth of approximately 0.3 microns on a peripheral region 38 such that the wide bandgap material is exposed at the upper surface 36 in the peripheral region 38. Advantage over the prior art is that the PN junction with the second device layer 14 remains undisturbed as compared to the mesa etch used in the prior art, as described hereinabove. The photo mask used is slightly smaller than that of the mesa pattern in the second device layer 16 so that the ohmic contact remains intact.

Subsequent to the etching of the upper surface 36 of the second device layer 16, a thin layer, of approximately 1,000 angstroms, is deposited on the upper surface 36 of the second device layer 16 to form the first passivation layer 18. The passivation layer 18 may be CdTe or any other insulator which adheres well to HgCdTe. The deposition of the first passivation layer 18 may be any technique, including MBE, MOCVD or ion assist. Preferably, the first passivation layer 18 is formed through an epitaxial growth. Alternatively, ion deposition of CdTe may also be used by focusing a Ar ion beam incident on a cadmium telluride source in a vacuum. The energetic ion beam produces energetically sputtered CdTe molecules which exhibit good adhesion to HgCdTe. This type of deposition is different from sputtering since the HgCdTe sample which is prone to damage is not situated in the plasma, but outside of it. The stoichiometry of the deposited CdTe is similar to bulk crystalline CdTe and it has very high resistivity.

Figure 3:
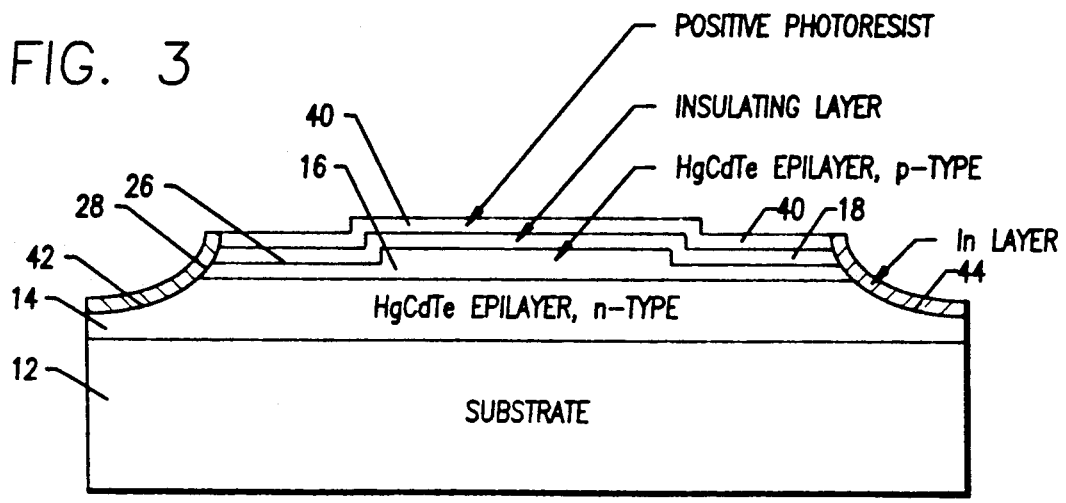

With further reference to FIG. 3, a photo resist layer 40 is placed, by conventional means, on the first passivation layer 18. The photo resist layer 40 is developed so that a mesa pattern is etched. The mesa etch forms the side surface 28 on the second device layer 16 and a side surface 42 on the first device layer 14. A side edge 44 is thus contiguous along each of the first device layer 14, second device layer 16, first passivation layer 18 and resist layer 40. After the mesa etch, the photo resist layer 40 is left intact.

The metal layer 22 is deposited on the edge 44 of the mesa. The metal layer 22 is approximately 100 angstroms thick. For the materials described hereinabove for the first device layer 14 and the second device layer 18, the metal layer is preferably formed from indium. The use of indium provides a Schottky barrier in the p-type second device layer 16 and an ohmic contact to the narrow bandgap n-type first device layer 14. The indium metal layer 22 also connects to the bottom of the mesas.

According to the invention, the PN junction interface has been accordingly moved from the narrow bandgap HgCdTe to the Schottky barrier on the wide bandgap HgCdTe. The Schottky barrier junction is terminated at the HgCdTe/CdTe interface between the second device 16 and the first passivation layer 18. Therefore, the PN junction is passivated in situ. Accordingly, the CdTe for the passivation layer 18 can be epitaxially grown because it is on the preferred crystalline point for epitaxy. Alternatively, if the HgCdTe surface 36 of the second device layer 16 is treated properly, the interface carrier recombination velocity is low so that an epitaxy grown CdTe passivation layer 18 is not required. In that case, any other insulator which adheres well to HgCdTe can be used. The photo resist layer 40 is left on for self alignment purposes so that the indium metal layer 22 can be deposited to the side of the CdTe passivation layer 18, contiguously along the wedge 44 of the mesa. After the indium metal layer 22 is deposited, the photo resist layer 40 can be removed.

Alternatively, a low temperature diffusion may be preformed to produce a diffused junction in the p-type HgCdTe second device layer 16. This may be accomplished by annealing the mesa structure at 140° C. for one hour. Thus, instead of a Schottky barrier wide bandgap diode for passivation, a diffused PN junction wide bandgap diode structure remains for passivation.

Furthermore, the deposition at the metal layer 22 is described hereinabove as moving the surface PN junction termination from the narrow bandgap region in the mesa structure to the upper wide bandgap Schottky junction. However, this process can be easily adapted to planar type diodes. In the planar diode, the PN junction is formed by either diffusion or implantation through an insulator mask. After the junction is formed, the insulator mask can be removed and an appropriate patter of indium is deposited over the p-type region and connected to the n-type region. Subsequently, a layer of passivation can be deposited over the wafer to accomplish the same function of the Schottky parameter diode structure described hereinabove.

Completing the structure of the detector 10 as shown in FIG. 4a, after the photo resist layer 40 is removed, a second passivation layer 20 is deposited over the first passivation layer 18 and the metal layer 22. The second passivation layer may also be CdTe or any other insulator which adheres well in HgCdTe. The indium of the metal layer 22 now forms a metal contact and a wide bandgap Schottky diode as described hereinabove. The second passivation layer 20 need not be provided since the junction has been passivated in situ. The subsequent processing of the detector 10 is conventional such as opening an hole 46 through the passivation layers 18, 20 and providing a metallization in each of the holes 46 for contact to the upper surface 36 of the second device layer 16 in its narrow region.

There has been described hereinabove a novel method for passivating PN junctions in semiconductor devices and the devices fabricated by such method. It is apparent that those skilled in the art may now make numerous uses of and departures from the above described Exemplary Preferred Embodiment without departing from the inventive concepts disclosed herein. Accordingly, the present is due to be defined solely by the scope of the following claims.

I claim:

1. A method for passivating a junction in a semiconductor device comprising the steps of:
    forming a first semiconductor device layer on a substrate;
    forming a second semiconductor device layer to form a junction between said first device layer and said second device layer;
    grading the composition of said second layer to vary the bandgap of said second layer between said junction and an upper surface of said second layer;
    etching selectively each of said first layer and said second layer to form a mesa wherein said mesa has an edge wall, said junction having a lateral edge exposed along said wall; and
    metallizing said wall with a metal forming an ohmic contact with the first one of said first device layer and said second device layer and forming a Schottky barrier with a second one of said first device layer and said second device layer.

2. A method as set forth in claim 1 wherein said first layer forming step includes the step of forming a heterojunction between said substrate and said first layer.

3. A method as set forth in claim 1 further comprising the steps of:
    forming a first passivation layer on said second device layer prior to said etching step, said edge wall being further formed along said passivation layer.

4. A method as set forth in claim 3 further comprising the steps of:
    forming a second passivation layer on said metal and said first passivation layer.

5. A method as set forth in claim 1 further comprising the steps of:

6. A method of passivating a junction in a semiconductor device comprising the steps of:
    forming a first semiconductor device layer of a first conductivity type on a substrate;
    forming a second semiconductor device layer of a second conductivity type opposite said first type on said first layer to form a junction therebetween;
    grading the composition of said second layer to vary the bandgap of said second layer between said junction and an upper surface of said second layer;
    etching selectively each of said first layer and said second layer to form a mesa wherein said mesa has an edge wall, said junction having a lateral edge exposed along said wall;

doping said edge wall to produce a diffused junction in said second layer, wherein said doping maintains the crystalline structure of said second layer; and forming a passivation layer on said second layer and said edge wall.

7. A method as set forth in claim 6 wherein said first layer forming step includes the substep of forming a heterojunction between said substrate and said first layer.

8. A method of fabricating a semiconductor device comprising:

forming an optically absorbent first semiconductor device layer of a first conductivity type on an optically transparent substrate;

forming a second semiconductor device layer of a second conductivity type opposite said first type on said first device layer to form a PN junction therebetween;

etching selectively each of said first layer and said second layer to form a mesa wherein said mesa has an edge wall, and further wherein said junction has a lateral edge exposed along said wall;

metallizing said wall with a metal selected to form an ohmic contact with said first layer and a Schottky barrier with said second layer so that said Schottky barrier extends upwardly from said PN junction to an upper surface of said second layer;

forming a passivation layer over said second layer and said metal with an opening in said passivation layer to expose a portion of said upper surface;

forming a first metal electrode in ohmic contact with said portion of said upper surface; and forming a second metal electrode in ohmic contact with said substrate.

9. A method as set forth in claim 8 wherein said first layer forming step includes the step of growing said first layer on said substrate.

10. A method as set forth in claim 9 wherein said growing step includes the step of orienting a surface of said substrate along a <1,1,1> plane.

11. A method as set forth in claim 9 wherein said growing step is a molecular beam epitaxy growing.

12. A method as set forth in claim 9 wherein said growing step is a metallorganic chemical vapor deposition growing.

13. A method as set forth in claim 9 wherein said growing is a liquid-phase epitaxy growing.

14. A method as set forth in claim 9 wherein said first layer growing step includes the further step of doping said first layered during said growing step.

15. A method as set forth in claim 9 wherein said growing step forms a heterojunction between a substrate and said first layer.

16. A method as set forth in claim 8 wherein said first layer forming step includes the step of growing a HgCdTe first device layer on one of a cadmium telluride and zinc cadmium telluride substrate.

17. A method as set forth in claim 16 wherein said growing step includes the step of orientating a surface of said substrate along a <1,1,1> plane.

18. A method as set forth in claim 16 wherein said growing step includes the steps of:
polishing said substrate in a Br:HBr solution; and
finishing a surface of said substrate prior to said first layer forming step with a Br:Ch:COOH solution.

19. A method as set forth in claim 16 wherein said growing step includes the further steps of:

loading said substrate in a liquid-phase epitaxy furnace; and epitaxially growing said HgCdTe first device layer in a tellurium solution until said first layer reaches a preselected thickness.

20. A method as set forth in claim 9 wherein said epitaxially growing step is completed when said first device layer becomes about 20 microns thick.

21. A method as set forth in claim 19 wherein said tellurium solution is maintained at about 20 degrees centrigrade.

22. A method as set forth in claim 19 wherein said HgCdTe first device layer is grown with a cadmium telluride composition between eighteen and thirty-two percent.

23. A method as set forth in claim 19 wherein said epitaxial growing step includes the further step of doping said first device layer with indium.

24. A method as set forth in claim 8 wherein said second device layer forming layer includes the steps of growing said second layer on said first layer.

25. A method as set forth in claim 24 wherein said growing step is a molecular beam epitaxy growing.

26. A method as set forth in claim 24 wherein said growing step is a metallorganic chemical vapor deposition growing.

27. A method as set forth in claim 24 wherein said growing is a liquid-phase epitaxy growing.

28. A method as set forth in claim 24 wherein said second device layer growing step includes the further step of doping said second layer during said growing step.

29. A method as set forth in claim 8 wherein said second layer forming steps includes the steps of growing a HgCdTe second device layer on a HgCdTe first device layer.

30. A method as set forth in claim 29 wherein said growing step includes the further steps of:
loading said substrate after forming said first layer into a liquid layer epitaxy furnace; and
epitaxially growing said HgCdTe second device layer in a tellurium solution until said second layer reaches a preselected thickness.

31. A method as set forth in claim 30 wherein said epitaxially growing step is completed when said second layer becomes about one micron thick.

32. A method of fabricating a semiconductor device comprising:

forming an optically absorbent first semiconductor device layer of HgCdTe possessing a first conductivity type on an optically transparent substrate;

loading said substrate with said first layer formed thereupon into a liquid layer epitaxy furnace;

epitaxially growing a HgCdTe second semiconductor device layer possessing a second conductivity type opposite said first type upon said first device layer;

growing said second layer in a tellurium solution until said second layer reaches a preselected thickness, thereby forming a PN junction between said first and second layers;

grading a composition of cadmium between said junction and an upper surface of said second layer;

etching selectively each of said first layer and said second layer to form a mesa wherein said mesa has an edge wall, and further wherein said junction has a lateral edge exposed along said wall;

metallizing said wall with a metal forming an ohmic contact with said first layer an forming a Schottky barrier with said second layer so that said Schottky barrier extends upwardly from said PN junction to an upper surface of said second layer;

forming a passivation layer over said second layer and said metal with an opening in said passivation layer to expose a portion of said upper surface;

forming a first metal electrode in ohmic contact with said portion of said upper surface; and forming a second metal electrode in ohmic contact with said substrate.

33. A method as set forth in claim 32 further comprising the steps of:

etching selectively a periphery of said upper surface of said second layer to thin said periphery, said composition of said second layer being of a larger bandgap within said periphery, said Schottky barrier being formed within said periphery.

34. A method as set forth in claim 32 wherein said composition is graded to form a narrower bandgap material adjacent said upper surface and said junction and a larger bandgap material therebetween.

35. A method of fabricating a semiconductor device comprising:

forming an optically absorbent first semiconductor device layer of a first conductivity type on an optically transparent substrate;

forming a second semiconductor device layer of a second conductivity type opposite said first type on said first device layer to form a PN junction therebetween;

grading the composition of said second layer to vary the bandgap of said second layer between said junction and an upper surface of said second layer;

etching selectively each of said first layer and said second layer to form a mesa wherein said mesa has an edge wall, and further wherein said junction has a lateral edge exposed along said wall;

metallizing said wall with a metal forming an ohmic contact with said first layer and forming a Schottky barrier with said second layer so that said Schottky barrier extends upwardly from said PN junction to an upper surface of said second layer;

forming a passivation layer over said second layer and said metal with an opening in said passivation layer to expose a portion of said upper surface;

forming a first metal electrode in ohmic contact with said portion of said upper surface; and forming a second metal electrode in ohmic contact with said substrate.

36. A method as set forth in claim 35 further comprising the step of:

etching selectively a periphery of said upper surface of said second layer to thin said periphery, said composition of said second layer being of a larger bandgap within said periphery, said Schottky barrier being formed within said periphery.

37. A method as set forth in claim 35 wherein said composition is graded to form a narrower bandgap material adjacent said upper surface and said junction and a larger bandgap material therebetween.

38. A method as set forth in claim 35 wherein said grading of said composition is accomplished by varying the relative proportion of cadmium in said composition.

39. A method for passivating a junction in a semiconductor device comprising the steps of:

forming a first semiconductor device layer on a substrate;

forming a second semiconductor device layer to form a junction between said first device layer and said second device layer;

grading the composition of said second layer to vary the bandgap of said second layer between said junction and an upper surface of said second layer;

etching selectively each of said first layer and said second layer to form a mesa wherein said means has an edge wall, said junction having a lateral edge exposed along said wall; and metallizing said wall and passivating said junction.

* * * * *